United States Patent [19]

Gaon

[11] 4,160,898
[45] Jul. 10, 1979

[54] SAFETY CIRCUIT TO PREVENT THE OBTAINING OF A FALSE COUNT FROM PRESETTABLE COUNTERS

[76] Inventor: Joseph Gaon, 64-50 229th St., Bayside, N.Y. 11364

[21] Appl. No.: 854,520

[22] Filed: Nov. 25, 1977

[51] Int. Cl.$^2$ ................. G06M 3/02; H03K 21/36
[52] U.S. Cl. ..................... 235/92 PE; 235/92 EP; 235/92 R; 328/48
[58] Field of Search .......... 235/92 FP, 92 PE, 92 SB, 235/92 CA, 92 EC, 92 EA; 328/48

[56] References Cited

U.S. PATENT DOCUMENTS 3,813,525  5/1974  Kitterman et al. ............. 235/92 PE
3,878,370  4/1975  Santomango et al. .......... 235/92 EC
3,976,859  8/1976  Christie et al. ................. 235/92 PE Primary Examiner—Joseph M. Thesz

[57] ABSTRACT

The invention is concerned with a circuit for the prevention of the obtaining of a false count from presettable counters and includes means to change the number or quantity to be counted. The safety circuit includes a pair of flip-flops, one of which is responsive to provide an output when the predetermined number is changed and to provide a second output after the predetermined number is changed and when the counter completes its count and the counter is to be reset. The second output activates the second flip-flop to insert a new predetermined number into the counter.

6 Claims, 1 Drawing Figure

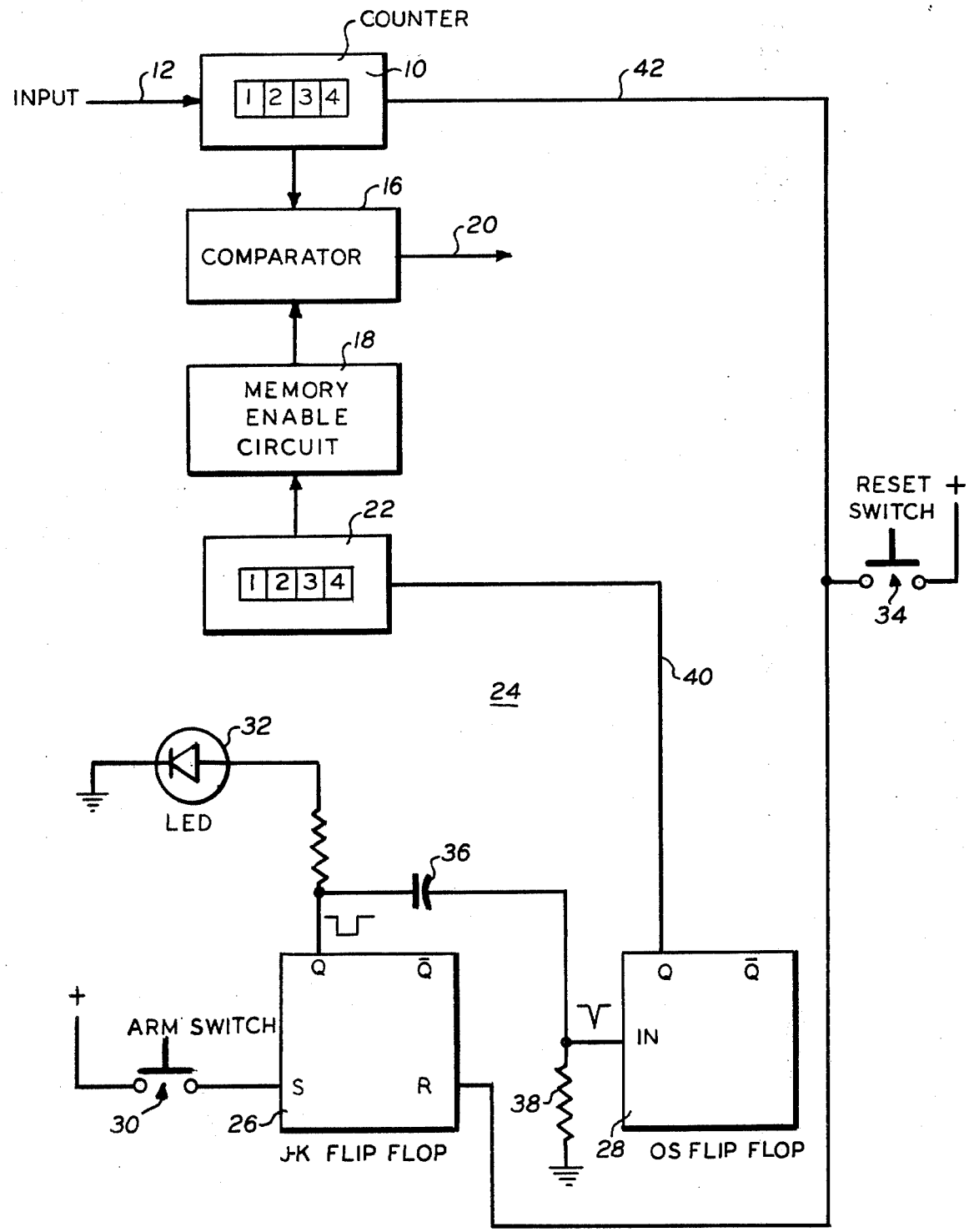

SAFETY CIRCUIT TO PREVENT THE OBTAINING OF A FALSE COUNT FROM PRESETTABLE COUNTERS

This invention relates to presettable counters, and more particularly to a safety circuit for preventing the obtaining of a false count.

Presettable counters are used for those functions where it is desired to obtain a predetermined count or quantity of some product. For example, in the packaging field, it is necessary for an accurate count to be obtained whether it is by number, by volume or by weight. In certain instances, where a volumetric measurement is to be obtained, such as for example, in the filling of milk containers, the count for a specific volume is determined by atmospheric conditions which change from day to day. Therefore, a preset count to provide a specific volume on one day may differ from the preset count to obtain the same volume on another day where the atmospheric conditions may differ. In addition, the density of the milk may also be affected by inherent conditions of the milk itself so that in order to obtain the proper volumetric quantity, it is necessary to change the number counted by the counters.

With present day counters, it is difficult, and sometimes impossible to introduce a new number or count into the counting mechanism, unless the entire operation is shut down which is a time consuming operation and involves much lost or down-time.

For example, assume that a counting mechanism is set to 9876. Now, if a new number is to be inserted into the counter, there is no assurance that at the time of the cycle at which the new number is to be inserted is the appropriate time. Assume that the number to be inserted is 8876. If at the time the number 8876 is to be inserted, the counter is reading 8877, a change to 8876 will not result in a stopping of the mechanism because the count has already passed 8876 and the counter will be ineffective to stop the counting operation. On the other hand, the counting mechanism may be below the number which is to be inserted and a coincidence may occur so that another false count will be obtained. Assume that the count is to be changed to 7865 from the original 9876 and while making the change, the count is at 0865, it being necessary to move the thousands place from 9 to 0 . . . 7, the counter will then indicate and decide it has finished the cycle at 0865 and start a new count. These types of false counts may occur innumerable times until the correct count is inserted, and thereby result in a large loss and waste of material.

Accordingly, when the present day counters are reset, and in the example set forth above, the counter may either: finish the cycle and go to 9876, only count to 8876, only count to some lower number such as 0876 because of the change, or keep on running because it has passed (or believes it has passed) the preset number.

It is therefore an object of the invention to enable the presetting of a counter during the counting operation without interference with the count and without providing a false signal.

With the present invention, it is now possible to dial in a new number and eliminate the necessity of comparators as well as the stopping of the counting operation.

The present invention provides for a transfer mechanism to control the time of transfer of a new predetermined number into the counter, so that transfer only takes place when the previous counting operation is completed. For this purpose, a transfer mechanism is provided which includes a J-K flip-flop and a one shot flip-flop which is only activated to insert a new predetermined number after a display device has had the new predetermined number inserted. An arming circuit is provided to arm the first flip-flop and provide an indication that a new predetermined number is ready to be transferred to the counter. The first flip-flop is then responsive to a resetting switch for resetting the counter, but is only effective to cause the first flip-flop to provide an output when a load register provides an output to the first flip-flop that the load register has completed its count and is returned to zero. The second flip-flop is a one-shot flip-flop which activates the display device to transfer the new predetermined number into the counter. Upon transfer, the counter is operative without interruption to provide a count based on the newly introduced predetermined number.

Other objects and features of the invention will become apparent from the single FIGURE of the drawing which illustrates the safety circuit in combination with the counter.

Referring now to the single FIGURE of the drawing, there is shown a conventional normally running counter or load register 10 having an input or pickup 12 and an output 14 which is fed to a comparator 16. The counter 10 is a digital counter which is related to the load or quantity of an item to be measured, and the material being measured has a pick-up coil or other suitable conventional pick-up, the output of which is fed to the counter 10. A memory enable circuit 18 is also connected with the comparator 16 and is arranged to feed into the comparator 16 a preselected count or quantity, as will be explained hereinafter. Comparator 16 is a coincidence circuit or AND circuit and is arranged to provide an output when the number in the load register 10 and in the memory circuit 18 are the same.

The output 20 from the comparator 16 is used for the conventional purpose of recycling the operation, so that if a milk container filling operation is to take place, the next container to be filled is moved into place and the container which has just been filled is moved to the next stage of operation.

Connected with the memory enable circuit 18 is a presettable switch and display device 22 which is used to set the number to be counted by the load register or counter 10. The presettable switch and display device is coupled in circuit with a transfer circuit 24 which is operative to transfer a number or quantity inserted into the display device 22 to the memory enable circuit 18 solely when the counter or load register 10 has completed its count.

The transfer circuit 24 includes a J-K flip-flop 26, a one shot flip-flop 28, an arming switch 30, a LED (light emitting diode) 32, a reset switch 34, and the output line 42 from counter 10.

The J-K flip-flop 26 has an S (Set or J input) input and an R (Reset or K input) input and Q, $\overline{Q}$ outputs. The one-shot flip-flop has a single input "IN" which is coupled to the output Q of flip-flop 26 through a differentiating circuit formed of capacitor 36 and resistor 38. The output Q of flip-flop 26 is also connected with the LED 32. The S-input is connected with the arming switch which when activated sets Q to "1," and the R-input is connected with the reset switch 34. When Q is set to 1 the output is positive going and produces a generally square wave positive output, the reset switch toggles R setting $\overline{Q}$ to 1 and Q to "0" (zero), if Q was previously set to "1." When Q is set to "0," the output of flip-flop 26 is negative and a negative square wave output is obtained and applied to the one shot flip-flop 28 through the differentiating circuit. After passing through the diffrentiating circuit 36, 38 a negative-going saw-tooth pulse is applied to the IN input of the one-shot multivibrator 28 to trigger it. The input of the one shot multivibrator 28 is only responsive to a negative-going saw-tooth wave. The output Q of the one-shot flip-flop 28 is connected via line 40 to the display device 22 for causing the number inserted to be transferred to the memory enable circuit 18 for applying a new number to the comparator 16. The output of counter on load register 10 is also connected via line 42 with the reset switch 34 and the R terminal of flip-flop 26.

The presettable switch and display device 22 may be manually changed or automatically changed to change the preselected count. In order to transfer the preselected count from device 22, it is necessary for the one-shot flip-flop 28 to be activated and to provide an output which is transferred via line 40 to device 22 which in turn causes the count to be transferred to the memory enable circuit 18. The preselected or preset number in device 22 may be changed whether counter 10 is counting or not. Then the arming switch 30 must be closed, and the closure of the switch 30, arms the counter and sets Q to 1. Setting Q to 1 provides the positive output which engages the LED 32. As a precaution it should be noted that no changes are to be made to the display device 22 while the counter is armed as an incorrect number or count can be inserted into the memory enable circuit 18.

At this point, even though the device 22 has been changed, the counter 10 will still go to its original count and produce an output.

In order to insert the new number from the display device 22 into the memory enable circuit 18, it is necessary to activate the reset switch 34. Activation of the reset switch 34, toggles the Reset input R setting $\bar{Q}$ to 1 and Q to zero (0) so as to provide a negative going output wave at Q of flip-flop 26; but this will only occur when the counter 10 has also been reset to zero and an output via 42 provides such indication to the R input. The negative output is differentiated and sets off the one-shot multivibrator 28 to provide an output at Q to transfer the number displayed in display device 22 to the memory enable circuit 18. The reset input R is responsive to the simultaneous occurence of input from the reset switch 34 and the completion of the count of counter or load register 10 to toggle flip-flop 26.

While there has been described what is at present considered to be the preferred embodiment of this invention, it will be obvious that various changes and modifications may be made without departing from the scope of the invention.

What I claim is:

1. In a counting device having a load register for registering a count characteristic of units to be counted, a memory enable circuit adapted for storing a number characteristic of the required number of units to be counted, a comparator coupled to both said load register and said memory enable circuit for providing an output when the load register reaches a count equal to the number stored in said memory enable circuit, an adjustable display device coupled with said memory enable circuit and adapted to transfer thereto of different numbers, and a safety switch circuit having a first flip-flop responsive to said load register completing its count, a second flip-flop coupled with said first flip-flop, and reset means coupled with said first flip-flop, said first flip-flop being responsive to said reset means upon activation thereof for triggering of said second flip-flop, means coupling the output of said second flip-flop with said display device for transferring the number in said display device to said memory enable circuit upon triggering of said second flip-flop.

2. In a device as claimed in claim 1, including means for arming of said safety circuit to permit a number different from the count into said display device.

3. In a device as claimed in claim 2, said first flip-flop including a J-K flip-flop having Q and $\bar{Q}$ outputs, a set input and a reset input, said arming circuit being coupled with said set input, a light-emitting diode coupled to the Q output of said J-K flip-flop, said light-emitting diode being activated in response to the activation of said arming circuit, means coupling said load register and said reset means to said reset input.

4. In a device as claimed in claim 3, said second flip-flop being a one shot flip-flop, said means coupling the output of said first flip-flops with the input of said second flip-flop including a differentiating circuit.

5. A safety circuit for preventing the obtaining of a false count for use in connection with a load register for registering a count, a memory enable circuit adapted to have a predetermined number inserted therein, and an AND gate coupled to the outputs of said load register and said enable circuit for providing an output when the count is the same as said predetermined number, and a transfer circuit for changing the predetermined number coupled with said enable circuit to provide a different predetermined number in said enable circuit without interrupting or affecting the output of said load register, said AND gate being responsive to said different predetermined number to provide an output when said load register registers a count the same as said different predetermined number including a register device adapted to receive the different predetermined number coupled with said enable circuit and said transfer circuit and responsive to the output thereof to transfer the different predetermined number to said enable circuit, said transfer circuit including first and second flip-flops intercoupled by a differentiating circuit, an indication means coupled to the output of said first flip-flop, and an arming device coupled to said first flip-flop to activate said indicating means when a different predetermined number is inserted into said register device.

6. The safety circuit as claimed in claim 5, including means coupling the output of said load register to said first flip-flop and reset means coupled to said first flip-flop to provide an output from said first flip-flop upon activation of one of said reset means and upon completing of the count by said load register only when said indicating means has been activated, said second flip-flop being responsive to said output from said first flip-flop to trigger said load register device to transfer the different predetermined number into said memory enable circuit.

* * * * *